US007935643B2

(12) United States Patent
Liang et al.

(10) Patent No.: US 7,935,643 B2
(45) Date of Patent: May 3, 2011

(54) STRESS MANAGEMENT FOR TENSILE FILMS

(75) Inventors: Jingmei Liang, San Jose, CA (US);
Anjana M. Patel, San Jose, CA (US);
Nitin K. Ingle, Santa Clara, CA (US);
Shankar Venkataraman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/604,332

(22) Filed: Oct. 22, 2009

(65) Prior Publication Data
US 2011/0034035 A1   Feb. 10, 2011

Related U.S. Application Data (60) Provisional application No. 61/231,729, filed on Aug. 6, 2009.

(51) Int. Cl.
*H01L 21/31*     (2006.01)
*H01L 21/469*    (2006.01)

(52) U.S. Cl. ............... 438/761; 438/758; 257/E21.273; 257/E21.279

(58) Field of Classification Search .......... 438/761–790, 438/424; 257/E21.273–E21.279, E21.548
See application file for complete search history.

(56) References Cited

U.S. PATENT DOCUMENTS

| 4,147,571 | A | 4/1979 | Stringfellow et al. |
|---|---|---|---|
| 4,816,098 | A | 3/1989 | Davis et al. |
| 4,818,326 | A | 4/1989 | Liu et al. |
| 4,931,354 | A | 6/1990 | Wakino et al. |
| 5,016,332 | A | 5/1991 | Reichelderfer et al. |
| 5,110,407 | A | 5/1992 | Ono et al. |
| 5,393,708 | A | 2/1995 | Hsia et al. |

(Continued)

FOREIGN PATENT DOCUMENTS

DE   19654737 A1   7/1997

(Continued)

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

(Continued)

*Primary Examiner* — Alexander G Ghyka
*Assistant Examiner* — Abdulfattah Mustapha
(74) *Attorney, Agent, or Firm* — Kilpatrick, Townsend and Stockton (57) ABSTRACT

The formation of a gap-filling silicon oxide layer with reduced tendency towards cracking is described. The deposition involves the formation of a flowable silicon-containing layer which facilitates the filling of trenches. Subsequent processing at high substrate temperature causes less cracking in the dielectric film than flowable films formed in accordance with methods in the prior art. A compressive liner layer deposited prior to the formation of the gap-filling silicon oxide layer is described and reduces the tendency for the subsequently deposited film to crack. A compressive capping layer deposited after a flowable silicon-containing layer has also been determined to reduce cracking. Compressive liner layers and compressive capping layers can be used alone or in combination to reduce and often eliminate cracking. Compressive capping layers in disclosed embodiments have additionally been determined to enable an underlying layer of silicon nitride to be transformed into a silicon oxide layer.

9 Claims, 6 Drawing Sheets

U.S. PATENT DOCUMENTS

| | | | |
|---|---|---|---|
| 5,426,076 A | 6/1995 | Moghadam | |
| 5,558,717 A | 9/1996 | Zhao et al. | |
| 5,587,014 A | 12/1996 | Leychika et al. | |
| 5,622,784 A | 4/1997 | Okaue et al. | |
| 5,635,409 A | 6/1997 | Moslehi | |
| 5,691,009 A | 11/1997 | Sandhu | |
| 5,786,263 A | 7/1998 | Perera | |
| 5,853,607 A | 12/1998 | Zhao et al. | |
| 5,937,308 A | 8/1999 | Gardner et al. | |
| 5,937,323 A | 8/1999 | Orczyk et al. | |
| 6,008,515 A | 12/1999 | Hsia et al. | |
| 6,009,830 A | 1/2000 | Li et al. | |
| 6,024,044 A | 2/2000 | Law et al. | |
| 6,087,243 A | 7/2000 | Wang | |
| 6,090,723 A | 7/2000 | Thakur et al. | |
| 6,140,242 A | 10/2000 | Oh et al. | |
| 6,146,970 A | 11/2000 | Witek et al. | |
| 6,156,581 A | 12/2000 | Vaudo et al. | |
| 6,165,834 A | 12/2000 | Agarwal et al. | |
| 6,180,490 B1 | 1/2001 | Vassiliev et al. | |
| 6,207,587 B1 | 3/2001 | Li et al. | |
| 6,302,964 B1 | 10/2001 | Umotoy et al. | |
| 6,383,954 B1 | 5/2002 | Wang et al. | |
| 6,387,207 B1 | 5/2002 | Janakiraman et al. | |
| 6,406,677 B1 | 6/2002 | Carter et al. | |
| 6,448,187 B2 | 9/2002 | Yau et al. | |
| 6,503,557 B1 | 1/2003 | Joret | |
| 6,506,253 B2 | 1/2003 | Sakuma | |
| 6,508,879 B1 | 1/2003 | Hashimoto | |
| 6,509,283 B1 | 1/2003 | Thomas | |
| 6,524,931 B1 | 2/2003 | Perera | |
| 6,528,332 B2 | 3/2003 | Mahanpour et al. | |
| 6,544,900 B2 | 4/2003 | Raaijmakers et al. | |
| 6,548,416 B2 | 4/2003 | Han et al. | |
| 6,548,899 B2* | 4/2003 | Ross | 257/750 |
| 6,559,026 B1* | 5/2003 | Rossman et al. | 438/424 |
| 6,566,278 B1 | 5/2003 | Harvey et al. | |
| 6,596,654 B1 | 7/2003 | Bayman et al. | |
| 6,614,181 B1 | 9/2003 | Harvey et al. | |
| 6,630,413 B2 | 10/2003 | Todd | |
| 6,660,391 B1 | 12/2003 | Rose et al. | |
| 6,676,751 B2 | 1/2004 | Solomon et al. | |
| 6,683,364 B2 | 1/2004 | Oh et al. | |
| 6,716,770 B2 | 4/2004 | O'Neill et al. | |
| 6,756,085 B2 | 6/2004 | Waldfried et al. | |
| 6,787,191 B2 | 9/2004 | Hanahata et al. | |
| 6,794,290 B1 | 9/2004 | Papasouliotis et al. | |
| 6,818,517 B1 | 11/2004 | Maes | |
| 6,830,624 B2 | 12/2004 | Janakiraman et al. | |
| 6,833,052 B2 | 12/2004 | Li et al. | |
| 6,833,322 B2 | 12/2004 | Anderson et al. | |
| 6,867,086 B1 | 3/2005 | Chen et al. | |
| 6,890,403 B2 | 5/2005 | Cheung | |
| 6,900,067 B2 | 5/2005 | Kobayashi et al. | |
| 6,955,836 B2 | 10/2005 | Kumagi et al. | |
| 6,958,112 B2 | 10/2005 | Karim et al. | |
| 7,018,902 B2 | 3/2006 | Visokay et al. | |
| 7,084,076 B2 | 8/2006 | Park et al. | |
| 7,115,419 B2 | 10/2006 | Suzuki | |
| 7,129,185 B2 | 10/2006 | Aoyama et al. | |
| 7,148,155 B1 | 12/2006 | Tarafdar et al. | |
| 7,205,248 B2 | 4/2007 | Li et al. | |
| 7,220,461 B2 | 5/2007 | Hasebe et al. | |
| 7,297,608 B1 | 11/2007 | Papasouliotis et al. | |
| 7,399,388 B2 | 7/2008 | Moghadam et al. | |
| 7,419,903 B2 | 9/2008 | Haukka et al. | |
| 7,435,661 B2 | 10/2008 | Miller et al. | |
| 7,498,273 B2 | 3/2009 | Mallick et al. | |
| 7,524,735 B1 | 4/2009 | Gauri et al. | |
| 7,541,297 B2 | 6/2009 | Mallick et al. | |
| 7,745,352 B2 | 6/2010 | Mallick et al. | |
| 7,790,634 B2 | 9/2010 | Munro et al. | |
| 7,803,722 B2 | 9/2010 | Liang | |
| 7,825,038 B2 | 11/2010 | Ingle et al. | |
| 7,825,044 B2 | 11/2010 | Mallick et al. | |
| 2001/0021595 A1 | 9/2001 | Jang et al. | |
| 2001/0029114 A1 | 10/2001 | Vulpio et al. | |
| 2001/0038919 A1 | 11/2001 | Berry et al. | |
| 2001/0054387 A1 | 12/2001 | Frankel et al. | |
| 2002/0048969 A1 | 4/2002 | Suzuki et al. | |
| 2002/0081817 A1 | 6/2002 | Bhakta et al. | |
| 2002/0127350 A1 | 9/2002 | Ishikawa et al. | |
| 2002/0142585 A1 | 10/2002 | Mandal | |
| 2002/0146879 A1 | 10/2002 | Fu et al. | |
| 2002/0164891 A1 | 11/2002 | Gates et al. | |
| 2003/0064154 A1 | 4/2003 | Laxman et al. | |
| 2003/0118748 A1 | 6/2003 | Kumagai et al. | |
| 2003/0124873 A1 | 7/2003 | Xing et al. | |
| 2003/0143841 A1 | 7/2003 | Yang et al. | |
| 2003/0159656 A1 | 8/2003 | Tan et al. | |
| 2003/0172872 A1 | 9/2003 | Thakur et al. | |
| 2003/0199151 A1 | 10/2003 | Ho et al. | |
| 2003/0232495 A1 | 12/2003 | Moghadam et al. | |
| 2004/0008334 A1 | 1/2004 | Sreenivasan et al. | |
| 2004/0020601 A1 | 2/2004 | Zhao et al. | |
| 2004/0048492 A1 | 3/2004 | Ishikawa et al. | |
| 2004/0065253 A1 | 4/2004 | Pois et al. | |
| 2004/0079118 A1 | 4/2004 | M'Saad et al. | |
| 2004/0146661 A1 | 7/2004 | Kapoor et al. | |
| 2004/0152342 A1 | 8/2004 | Li et al. | |
| 2004/0161899 A1 | 8/2004 | Luo et al. | |
| 2004/0175501 A1 | 9/2004 | Lukas et al. | |
| 2004/0180557 A1 | 9/2004 | Park et al. | |
| 2004/0185641 A1 | 9/2004 | Tanabe et al. | |
| 2004/0219780 A1 | 11/2004 | Ohuchi | |
| 2004/0241342 A1 | 12/2004 | Karim et al. | |
| 2005/0001556 A1 | 1/2005 | Hoffman et al. | |
| 2005/0019494 A1 | 1/2005 | Moghadam et al. | |
| 2005/0026443 A1 | 2/2005 | Goo et al. | |
| 2005/0062165 A1 | 3/2005 | Saenger et al. | |
| 2005/0087140 A1 | 4/2005 | Yuda et al. | |
| 2005/0142895 A1 | 6/2005 | Ingle et al. | |
| 2005/0153574 A1* | 7/2005 | Mandal | 438/790 |
| 2005/0181555 A1 | 8/2005 | Haukka et al. | |
| 2005/0186731 A1 | 8/2005 | Derderian et al. | |
| 2005/0196533 A1 | 9/2005 | Hasebe et al. | |
| 2005/0227499 A1 | 10/2005 | Park et al. | |
| 2005/0250340 A1 | 11/2005 | Chen et al. | |
| 2006/0011984 A1 | 1/2006 | Curie | |
| 2006/0014399 A1 | 1/2006 | Joe | |
| 2006/0030165 A1 | 2/2006 | Ingle et al. | |
| 2006/0055004 A1 | 3/2006 | Gates et al. | |
| 2006/0068599 A1 | 3/2006 | Baek et al. | |
| 2006/0096540 A1 | 5/2006 | Choi | |
| 2006/0110943 A1 | 5/2006 | Swerts et al. | |
| 2006/0121394 A1 | 6/2006 | Chi | |
| 2006/0162661 A1 | 7/2006 | Jung et al. | |
| 2006/0178018 A1 | 8/2006 | Olsen | |
| 2006/0223315 A1 | 10/2006 | Yokota et al. | |
| 2006/0228903 A1 | 10/2006 | McSwiney et al. | |
| 2006/0281496 A1 | 12/2006 | Cedraeus | |
| 2006/0286776 A1 | 12/2006 | Ranish et al. | |
| 2007/0020392 A1 | 1/2007 | Kobrin et al. | |
| 2007/0026689 A1 | 2/2007 | Nakata et al. | |
| 2007/0049044 A1 | 3/2007 | Marsh | |
| 2007/0077777 A1 | 4/2007 | Gumpher | |
| 2007/0092661 A1 | 4/2007 | Ryuzaki et al. | |
| 2007/0128864 A1 | 6/2007 | Ma et al. | |
| 2007/0173073 A1 | 7/2007 | Weber | |
| 2007/0181966 A1 | 8/2007 | Watatani et al. | |
| 2007/0232071 A1* | 10/2007 | Balseanu et al. | 438/694 |
| 2007/0232082 A1 | 10/2007 | Balseanu et al. | |
| 2007/0275569 A1* | 11/2007 | Moghadam et al. | 438/781 |
| 2007/0281495 A1 | 12/2007 | Mallick et al. | |
| 2007/0281496 A1 | 12/2007 | Ingle et al. | |
| 2008/0085607 A1 | 4/2008 | Yu et al. | |
| 2008/0102223 A1 | 5/2008 | Wagner et al. | |
| 2009/0061647 A1 | 3/2009 | Mallick et al. | |
| 2009/0104755 A1* | 4/2009 | Mallick et al. | 438/477 |

FOREIGN PATENT DOCUMENTS

| | | |
|---|---|---|
| EP | 0892083 A1 | 1/1999 |
| EP | 1717848 A | 11/2006 |
| JP | 01241826 A | 9/1989 |
| KR | 10-2004-0091978 A | 11/2004 |
| KR | 10-2005-0094183 A | 9/2005 |
| WO | WO 02/077320 A1 | 10/2002 |

| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |

OTHER PUBLICATIONS

Gulleri, G. et al., "Deposition Temperature Determination of HDPCVD Silicon Dioxide Films," 2005, Microelectronic Engineering, vol. 82, pp. 236-241.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.

Tsu, D. V. et al., "Silicon Nitride and Silicon Diimide Grown By Remote Plasma Enhanced Chemical Vapor Deposition", Journal of Vacuum Science and Technoology: Part A, AVS/AIP, Melville, NY.; US, vol. 4, No. 3, Part 01, May 1, 1986, pp. 480-485.

* cited by examiner

STRESS MANAGEMENT FOR TENSILE FILMS

CROSS-REFERENCES TO RELATED APPLICATIONS

This application is related to U.S. Prov. Pat. App. Ser. No. 61/231,729, filed Aug. 6, 2009, and titled "FORMATION OF SILICON OXIDE USING NON-CARBON FLOWABLE CVD PROCESSES," the entire contents of which is herein incorporated by reference for all purposes.

BACKGROUND OF THE INVENTION

Semiconductor device geometries have dramatically decreased in size since their introduction several decades ago. Modern semiconductor fabrication equipment routinely produces devices with 250 nm, 180 nm, and 65 nm feature sizes, and new equipment is being developed and implemented to make devices with even smaller geometries. The decreasing feature sizes result in structural features on the device having decreased spatial dimensions. The widths or gaps and trenches on the device narrow to a point where the aspect ratio of gap depth to its width becomes high enough to make it challenging to fill the gap with dielectric material. The depositing dielectric material is prone to clog at the top before the gap completely fills, producing a void or seam in the middle of the gap.

Over the years, many techniques have been developed to avoid having dielectric material clog the top of a gap, or to "heal" the void or seam that has been formed. One approach has been to start with highly flowable precursor materials that may be applied in a liquid phase to a spinning substrate surface (e.g., SOG deposition techniques). These flowable precursors can flow into and fill very small substrate gaps without forming voids or weak seams. However, once these highly flowable materials are deposited, they have to be hardened into a solid dielectric material.

In many instances, the hardening process includes a heat treatment to remove carbon and hydroxyl groups from the deposited material to leave behind a solid dielectric such as silicon oxide. Unfortunately, the departing carbon and hydroxyl species often leave behind pores in the hardened dielectric that reduce the quality of the final material. In addition, the hardening dielectric also tends to shrink in volume, which can leave cracks and spaces at the interface of the dielectric and the surrounding substrate. In some instances, the volume of the hardened dielectric can decrease by 40% or more.

Thus, there is a need for new deposition processes and materials to form dielectric materials on structured substrates without generating voids, seams, or both, in substrate gaps and trenches. There is also a need for materials and methods of hardening flowable dielectric materials with fewer pores and less shrinkage as well as accommodating the shrinkage which still occurs. This and other needs are addressed in the present application.

BRIEF SUMMARY OF THE INVENTION

The formation of a gap-filling silicon oxide layer with reduced tendency towards cracking is described. The deposition involves the formation of a flowable silicon-containing layer which facilitates the filling of trenches. Subsequent processing at high substrate temperature causes less cracking in the dielectric film than flowable films formed in accordance with methods in the prior art. A compressive liner layer deposited prior to the formation of the gap-filling silicon oxide layer is described and reduces the tendency for the subsequently deposited film to crack. A compressive capping layer deposited after a flowable silicon-containing layer has also been determined to reduce cracking. Compressive liner layers and compressive capping layers can be used alone or in combination to reduce and often eliminate cracking. Compressive capping layers in disclosed embodiments have additionally been determined to enable an underlying layer of silicon nitride to be transformed into a silicon oxide layer.

In one embodiment, a method of forming a silicon oxide layer on a substrate containing a trench includes transferring the substrate into a substrate processing chamber; forming a compressive lining layer on the substrate and in the trench; forming a dielectric layer on the substrate and in the trench, wherein the dielectric layer is initially flowable; and curing the dielectric layer.

In yet another embodiment, a method of forming a silicon oxide layer on a substrate containing a trench includes transferring the substrate into a substrate processing region in a substrate processing chamber; flowing a plasma precursor into a remote plasma region to form plasma effluents; combining the plasma effluents with a flow of a silicon-containing precursor in the substrate processing region, wherein the flow of the silicon-containing precursor has not been excited by a plasma; forming a silicon-and-oxygen-containing layer on the substrate and in the trench; forming a compressive capping layer over the silicon-and-oxygen-containing layer; and curing the silicon-and-oxygen-containing layer.

In yet another embodiment, a method of forming a silicon oxide layer on a substrate containing a trench includes transferring the substrate into a substrate processing region in a substrate processing chamber; flowing a plasma precursor into a remote plasma region to form plasma effluents; combining the plasma effluents with a flow of a silicon-containing precursor in the substrate processing region, wherein the flow of the silicon-containing precursor has not been excited by a plasma; forming a silicon-and-nitrogen-containing layer on the substrate and in the trench; forming a compressive capping layer over the silicon-and-nitrogen-containing layer; and heating the substrate in an oxygen-containing atmosphere to convert the carbon-free silicon-and-nitrogen containing layer to the silicon oxide layer.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

The formation of a gap-filling silicon oxide layer with reduced tendency towards cracking is described. The deposition involves the formation of a flowable silicon-containing layer which facilitates the filling of trenches. Subsequent processing at high substrate temperature causes less cracking in the dielectric film than flowable films formed in accordance with methods in the prior art. A compressive liner layer deposited prior to the formation of the gap-filling silicon oxide layer is described and reduces the tendency for the subsequently deposited film to crack. A compressive capping layer deposited after a flowable silicon-containing layer has also been determined to reduce cracking. Compressive liner layers and compressive capping layers can be used alone or in combination to reduce cracking. Compressive capping layers in disclosed embodiments have additionally been determined to enable an underlying layer of silicon nitride to be transformed into a silicon oxide layer.

Without binding the coverage of the claims to hypothetical process mechanisms, inclusion of either a compressive liner layer and/or a compressive capping layer is thought to stabilize the flowable gap-filling silicon oxide layer during and after subsequent processing. Flowable films may require curing either as a distinct curing step or as a natural by-product of heating a film stack including the gap-filling film during subsequent processing. The gap-filling film is typically reduced in mass through outgassing and develops tensile stress. Such a layer may be referred to herein as a tensile layer. The compressive liner layer is thought to stabilize trenches prior to the filling of the gap with the flowable gap-filling silicon oxide layer. The presence of a compressive liner layer and/or a compressive capping layer also may serve to physically adhere to and stabilize the gap-filling layer. The physical curvature of the substrate as a whole may also be mitigated by the presence of the compressive layers, reducing the curvature imparted during curing of the gap-filling film reducing its tensile stress during subsequent processing. Additional details about the methods and systems of forming the silicon oxide layer will now be described.

Exemplary Silicon Oxide Formation Processes

Figure 1:
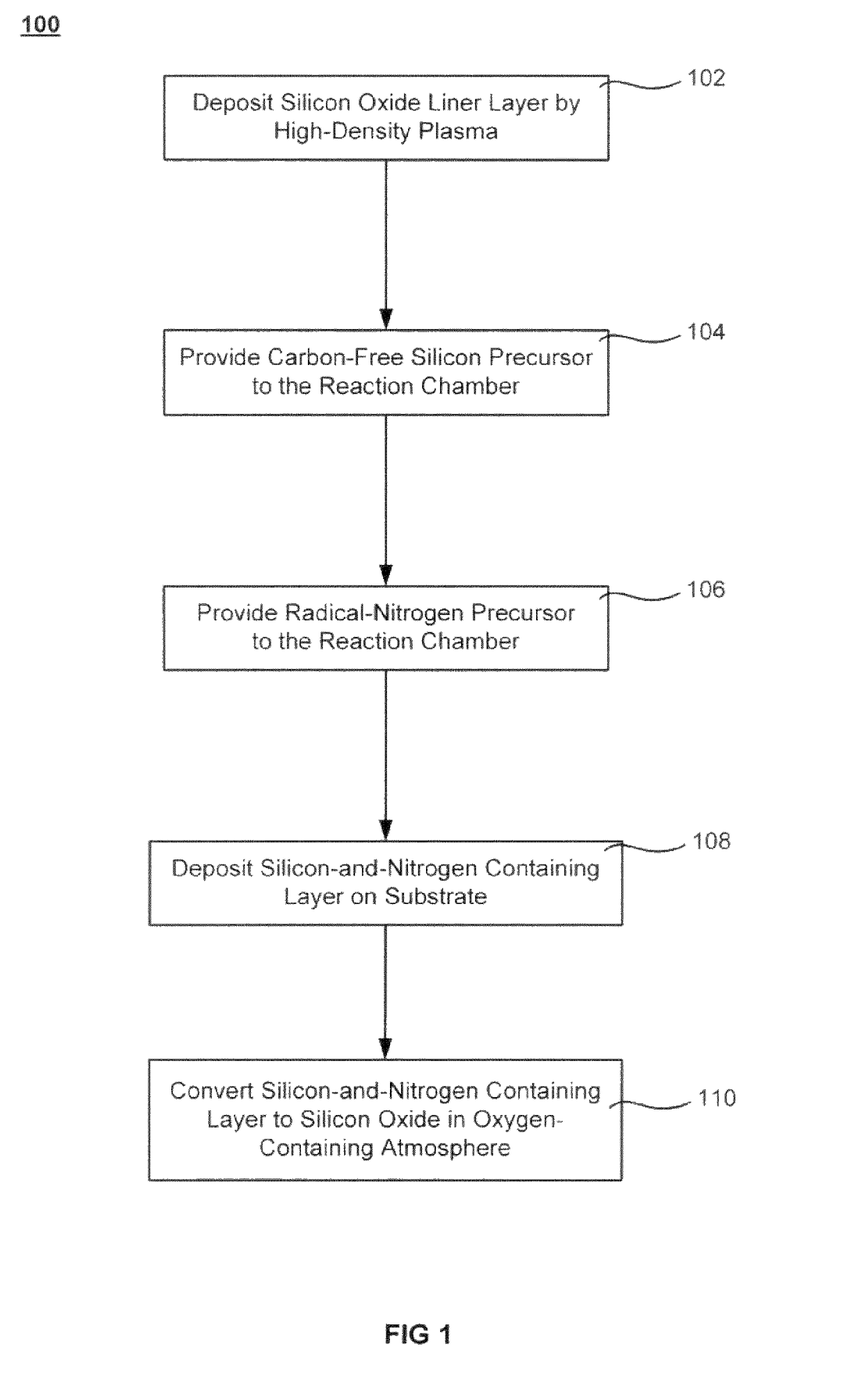
FIG. 1 is a flowchart illustrating selected steps for making a multi-layer silicon oxide film according to disclosed embodiments.

FIG. 1 is a flowchart showing selected steps in methods 100 of making silicon oxide films according to embodiments of the invention. The method 100 includes depositing a silicon oxide liner layer by high-density plasma CVD (HDP-CVD) on a substrate 102. HDP-CVD is an exemplary method of forming a silicon oxide layer which exhibits tensile stress especially upon cooling the substrate following the composite deposition process. Other methods may be used (e.g. PECVD, LP-CVD or furnace oxide) to form the silicon oxide compressive lining layer which would be similarly effective at inhibiting the formation of cracks in the completed film stack during and following curing/heating of the film stack. The compressive lining layer may also be silicon nitride grown by a variety of techniques including HDP-CVD, PECVD, LP-CVD and by using a high temperature furnace.

The method 100 further includes providing a carbon-free silicon precursor to a reaction chamber 104. The carbon-free silicon precursor may be, for example, a silicon-and-nitrogen precursor, a silicon-and-hydrogen precursor, or a silicon-nitrogen-and-hydrogen containing precursor, among other classes of silicon precursors. Specific examples of these precursors may include silyl-amines such as $H_2N(SiH_3)$, $HN(SiH_3)_2$, and $N(SiH_3)_3$, among other silyl-amines. These silyl-amines may be mixed with additional gases that may act as carrier gases, reactive gases, or both. Examples of the these additional gases may include $H_2$, $N_2$, $NH_3$, He, and Ar, among other gases. Examples of carbon-free silicon precursors may also include silane ($SiH_4$) either alone or mixed with other silicon (e.g., $N(SiH_3)_3$), hydrogen (e.g., $H_2$), and/or nitrogen (e.g., $N_2$, $NH_3$) containing gases.

A radical-nitrogen precursor may also be provided to the reaction chamber 106. The radical-nitrogen precursor comprises plasma effluents created by exciting a nitrogen-containing precursor in a plasma and exemplary nitrogen-containing precursors may include $N_2O$, NO, $NO_2$, $NH_4OH$, $NH_3$ and $N_2$. The radical-nitrogen precursor may be a nitrogen-radical containing species that was generated outside the reaction chamber from a more stable nitrogen precursor. For example, a stable nitrogen precursor compound such as those listed above may be activated in a plasma unit outside the reaction chamber to form the radical-nitrogen precursor, which is then transported into the reaction chamber. The radical-nitrogen precursor produced may include one or more of .N, .NH, .$NH_2$, etc., and may also be accompanied by ionized species formed in the plasma. In other embodiments, the radical-nitrogen precursor is generated in a section of the reaction chamber partitioned from the substrate processing region where the precursors mix and react to deposit the silicon-and-nitrogen layer on a deposition substrate (e.g., a semiconductor wafer). The radical-nitrogen precursor may also be accompanied by a carrier gas such as hydrogen ($H_2$), helium, etc.

In the reaction chamber, the unexcited carbon-free silicon precursor and the radical-nitrogen precursor mix and react to deposit a silicon-and-nitrogen containing film on the deposition substrate 108 with trenches formed in its surface. Trenches may be difficult to fill without forming voids or seams using less flowable films produced with prior art gap-filling techniques such as HDP-CVD. The trenches may have a height and width that define an aspect ratio (AR) of the height to the width (i.e., HAW) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths that range from about 90 nm to about 22 nm or less (e.g., about 90 nm, 65 nm, 45 nm, 32 nm, 22 nm, 16 nm, etc.).

Unlike a conventional silicon nitride ($Si_3N_4$) film, the deposited silicon-and-nitrogen containing film has flowable characteristics allowing it to flow into narrow gaps trenches and other structures on the deposition surface of the substrate. Because the layer is flowable, it can fill gaps with high aspect ratios without creating voids or weak seams around the center of the filling material. For example, a depositing flowable material is less likely to prematurely clog the top of the gap before it is completely filled. This may help to reduce or eliminate voids which remain in the middle of the gap.

The flowability may be due, at least in part, to a significant hydrogen component in the deposited film. For example the deposited film may have a silazane-type, Si—NH—Si backbone (i.e., a Si—N—H film). Flowability may also result from short chained polymers of the silazane type. When both the silicon precursor and the radical-nitrogen precursor are carbon-free, the deposited silicon-and-nitrogen-containing film is also substantially carbon-free. Of course, "carbon-free" does not necessarily mean the film lacks even trace amounts of carbon. Carbon contaminants may be present in the precursor materials that find their way into the deposited silicon-and-nitrogen-containing film. The amount of these carbon impurities however are much less than would be found in a silicon precursor having a carbon moiety (e.g., TEOS, TMDSO, etc.).

Following the deposition of the silicon-and-nitrogen containing layer, the deposition substrate may be introduced to a oxygen-containing atmosphere 110. The deposition substrate may remain in the reaction chamber when the oxygen-containing atmosphere is introduced, or the substrate may be transferred to a different chamber where the oxygen-containing atmosphere is introduced. The oxygen-containing atmosphere may include one or more oxygen containing gases such as molecular oxygen ($O_2$), ozone ($O_3$), water vapor ($H_2O$), and nitrogen-oxides (NO, $NO_2$, etc.), among other oxygen-containing gases. The oxygen-containing atmosphere may also include radical oxygen and hydroxyl species such as atomic oxygen (O), hydroxides (OH), etc., that may be generated remotely and transported into the substrate chamber. Ions of oxygen-containing species may also be present.

The oxygen-containing atmosphere provides oxygen to convert the silicon-and-nitrogen containing film into the silicon oxide ($SiO_2$) film 110. As noted previously, the lack of carbon in the silicon-and-nitrogen containing film results in significantly fewer pores formed in the final silicon oxide film. The net shrinkage from deposition to anneal is reduced by depositing a flowable silicon-and-nitrogen-containing film and converting to silicon oxide as opposed to depositing a flowable silicon-and-oxygen-containing film initially. During the conversion process, the substrate temperature may range from about 25° C. to about 1100° C. (e.g., about 200° C., about 300° C., about 400° C., about 500° C., about 600° C., about 700° C., about 800° C., about 900° C., about 1000° C., etc.). In many cases, the volume reduction is slight enough (e.g., about 15 vol. % or less) to avoid post heat treatment steps to fill, heal, or otherwise eliminate spaces that form in the gap as a result of the shrinking silicon oxide. In an embodiment, the conversion may occur in two parts. The two part conversion may include a low temperature ozone cure to initiate the oxidation followed by a high temperature anneal in an oxygen-containing environment.

The process of FIG. 1 describes a process wherein silicon oxide is formed by first depositing a silicon-nitrogen-containing layer and then converting the layer into silicon oxide. In other embodiments, the deposited film is created by a radical-oxygen precursor combining with a carbon-containing precursor which has not been excited by a plasma. The deposited film would then be a silicon-and-oxygen-containing film which may experience more shrinkage during subsequent processing compared with a process involving a silicon-and-nitrogen-containing film. Exemplary carbon-containing precursor which does not pass through a plasma may include TMOS, TriMOS, TEOS, OMCTS, HMDS, TMCTR, TMCTS, OMTS, TMS, HMDSO and/or TMDSO. The radical-oxygen precursor comprises plasma effluents created by exciting an oxygen-containing precursor in a plasma and exemplary oxygen-containing precursors may include $O_2$, $O_3$, $N_2O$, NO, $NO_2$, $H_2O_2$, $H_2O$ and $NH_4OH$. Cracking in films deposited in this manner may also be reduced by using compressive lining and capping layers described herein.

Embodiments may include multiple heating stages with different temperatures and atmospheres. For example, a first heating stage may be performed at a lower first temperature in an atmosphere that includes steam ($H_2O$), while a second heating stage may be performed at a higher second temperature in a dry oxygen-containing atmosphere which substantially lacks water vapor. A third heating stage may also be conducted in a non-oxygen containing atmosphere (e.g., dry $N_2$, He, Ar, etc.).

Figure 2:
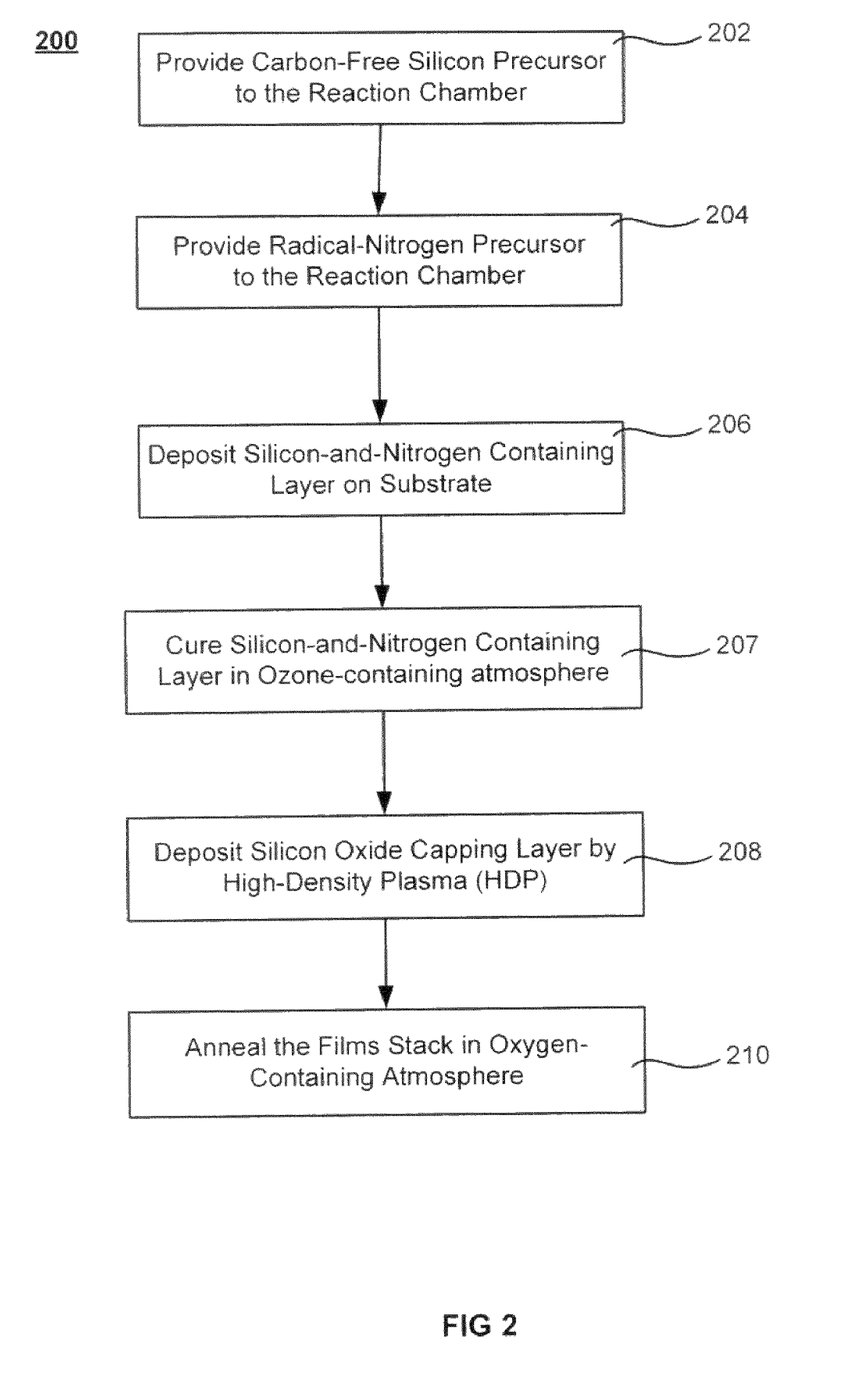
FIG. 2 is another flowchart illustrating selected steps for forming a multi-layer silicon oxide film according to disclosed embodiments.

Referring now to FIG. 2, another flowchart is shown illustrating selected steps in methods 200 for forming a silicon oxide film in a trench according to embodiments of the invention. The method 200 may include transferring a substrate with surface trenches into a substrate processing region. The trenches may be used to dictate the spacing and structure of device components (e.g., transistors) formed on the substrate. The method 200 includes providing a carbon-free silicon precursor to a reaction chamber 202. Carbon-free silicon precursors were discussed in conjunction with FIG. 1. A radical-nitrogen precursor is provided to the reaction chamber 204 as described with reference to FIG. 1. Again, alternative embodiments involve introducing an unexcited carbon-containing precursor and a radical-oxygen precursor to form a flowable silicon-and-oxygen-containing film which may exhibit relatively more shrinkage during subsequent processing.

The carbon-free silicon precursor and the radical-nitrogen precursor mix and react to deposit a flowable silicon and nitrogen containing film on the deposition substrate (operation 206). The flowable nature of the film facilitates the filling of the surface trenches which may otherwise be difficult to completely fill using less flowable films produced with prior art gapfilling techniques such as HDP-CVD. Following the deposition, ozone is flowed into the reaction region and the substrate is heated to a relatively low temperature to initiate the oxidation and conversion of the silicon-and-nitrogen-containing film into silicon dioxide (operation 207).

A compressive capping layer is then deposited over the cured film which contains silicon, oxygen and possibly nitrogen 208. One way to deposit a capping layer under compressive strain is to deposit it with HDP-CVD similar to the method of depositing the liner layer of FIG. 1. The capping layer may be made thicker than the lining layer since the trenches are largely filled at this point in the process. Compressive capping layers are integrated into the process flow and may enable the use of a thinner flowable film due to the additional material provided by the compressive capping layer. In some embodiments, the trench is not completely filled with the gap-filling layer, in which case the compressive capping layer fills some of the trench volume. Once again, other methods may be used to produce the compressive capping layer (e.g. PECVD, LP-CVD, furnace oxide) which would be similarly effective at inhibiting the formation of cracks in the completed film stack during and following annealing of the film stack. The compressive capping layer may also be silicon nitride grown by a variety of techniques including HDP-CVD, PECVD, LP-CVD and by using a high temperature furnace.

Following the deposition of the compressive capping layer, the deposition substrate may be introduced to a oxygen-containing atmosphere 210. Again, the deposition substrate may remain in the reaction chamber where the oxygen-containing atmosphere is introduced, or the substrate may be transferred to a different chamber where the oxygen-containing atmosphere is introduced. The oxygen-containing atmosphere is as described with reference to FIG. 1. The oxygen-containing atmosphere provides oxygen to complete the conversion of the silicon-and-nitrogen-containing film into silicon oxide, a conversion which was initiated during the cure. The conversion has been found to proceed despite the presence of the compressive capping layer. Heating the cured silicon-and-nitrogen containing layer in an oxygen-containing atmosphere again forms a silicon oxide layer on the substrate and in the substrate gap. The silicon oxide layer has fewer pores and less volume reduction than similar layers formed with carbon-containing precursors that have significant quantities of carbon present in the layer before the heat treatment step. Compressive lining layers of FIG. 1 and compressive capping layers of FIG. 2 may be combined, in disclosed embodiments, to further protect a film stack from developing cracks.

Figure 3:
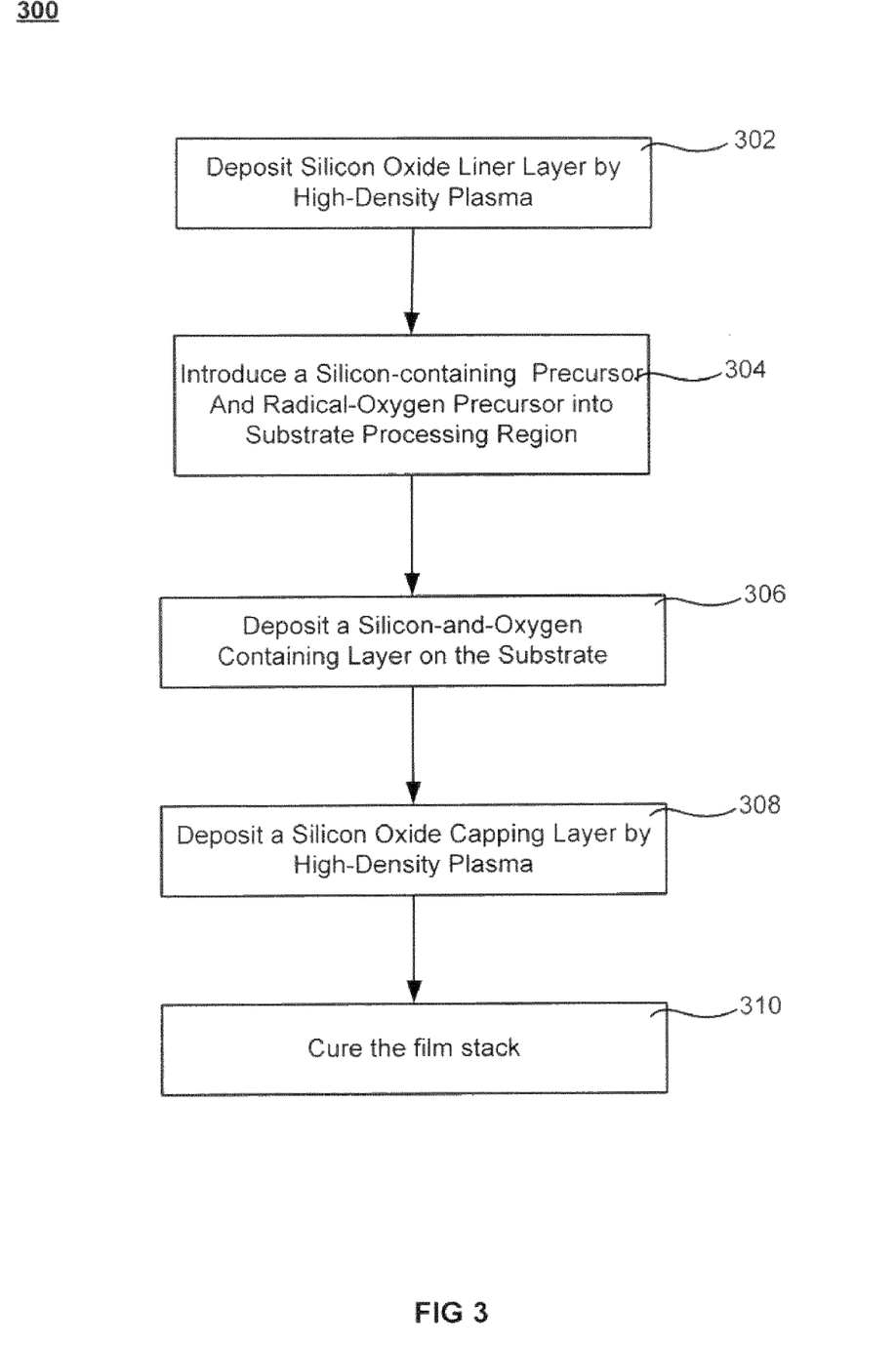
FIG. 3 is another flowchart illustrating selected steps for forming a multi-layer silicon oxide film according to disclosed embodiments.

FIG. 3 is another flowchart illustrating selected steps in additional exemplary methods 300 of making a silicon oxide film according to embodiments of the invention. The methods 300 include depositing a silicon oxide liner layer by high-density plasma CVD (HDP-CVD) on a substrate 302. Other methods may be used (e.g. PECVD, LP-CVD and furnace oxide) to form the compressive lining layer provided the alternative methods form a compressive lining layer to assist with a reduction in cracking during and following curing and heating steps later in the processing sequence. The methods 300 further include introducing a silicon-containing precursor and a radical-oxygen precursor into a substrate processing region 304.

The radical-oxygen precursor may be generated outside the plasma CVD deposition chamber, for example, from a stable oxygen-containing gas (e.g., molecular oxygen ($O_2$), ozone ($O_3$), water vapor, hydrogen peroxide ($H_2O_2$), and nitrogen oxides (e.g., $N_2O$, $NO_2$, etc.)). As with the methods of FIGS. 1-2, mixtures of stable gases may also be used to form the radical species. The radical oxygen may also be created in a separated section of the reaction chamber partitioned from the substrate processing region. In that separated section, the stable oxygen-containing gas is excited by a plasma remote from the substrate processing region. The partition may have apertures and may be referred to as a showerhead herein.

The silicon-containing precursor is introduced directly into the substrate processing region to avoid plasma excitation in disclosed embodiments. The silicon-containing precursor may include organo-silane compounds including TMOS, TriMOS, TEOS, OMCTS, HMDS, TMCTR, TMCTS, OMTS, TMS, and HMDSO, among others. The silicon-containing precursors may also include silicon compounds that have no carbon, such as silane, disilane, etc. If the deposited oxide film is a doped oxide film, dopant precursors may also be used such as TEB, TMB, $B_2H_6$, TEPO, $PH_3$, $P_2H_6$, and TMP, among other boron and phosphorous dopants. Dopants may also be used in the methods discussed with reference to FIGS. 1-2.

In the reaction chamber, the silicon precursor and the radical-oxygen precursor mix and react to deposit a silicon-and-oxygen-containing film on the deposition substrate 306 with trenches formed in its surface. The trenches may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths that range from about 90 nm to about 22 nm or less (e.g., about 90 nm, 65 nm, 45 nm, 32 nm, 22 nm, 16 nm, etc.).

The films produced with these methods are initially flowable which enables them to flow into narrow gaps or trenches and other structures on the deposition surface of the substrate. The films flow into gaps with high aspect ratios without creating voids or weak seams around the center of the filling material. For example, a depositing flowable material is less likely to prematurely clog the top of a gap before it is completely filled to leave a void in the middle of the gap.

Following the deposition of the silicon-and-oxygen containing film, a compressive capping layer is deposited over the silicon-and-nitrogen-containing film 308. One way to deposit a capping layer under compressive strain is to deposit it with HDP-CVD similar to the method of depositing the liner layers of FIG. 1 and the capping layers of FIG. 2. The capping layer may be made thicker than the lining layers of FIG. 1 and operation 302 since the trenches are largely filled at this point in the process. Compressive capping layers are integrated into the process flow and may enable the use of a thinner flowable film due to the additional material provided by the compressive capping layer. In alternative embodiments, a liner layer is used without a capping layer and a capping layer is used without a lining layer.

The film stack is cured in operation 310 to remove some of the flowing agents left in the film. Any outgassing from the curing film occurs despite the presence of the compressive capping layer. A cure step may not be necessary depending on the desired properties of the final film stack. In other embodiments, the film is cured in the course of further processing which inevitably involves some heating of the substrate.

Turning now to discuss general properties of the compressive layers presented herein, compressive liner layer according to disclosed embodiments are thinner than half the width of the trenches in order to allow the subsequently deposited flowable film to flow into the remaining gap. The thickness of the lining layer may be less than or about 400 Å, less than or about 300 Å, less than or about 200 Å or less than or about 150 Å in different embodiments. The compressive lining layers must be thick enough to provide the necessary stability for the trenches and are thicker than or about 25 Å, thicker than or about 50 Å, thicker than or about 100 Å or thicker than or about 150 Å in different embodiments. Any of the upper limits may be combined with any of the lower limits to form additional embodiments.

Compressive capping layers presented herein have more latitude than the compressive lining layers since they are not constrained by the width of the substrate trenches. Compressive capping layers may be thicker than or about 25 Å, thicker than or about 50 Å, thicker than or about 100 Å, thicker than or about 200 Å, thicker than or about 300 Å or thicker than or about 400 Å in different embodiments. Upper limits on the thickness of the compressive capping layer are typically determined by a particular process flow in conjunction with the final thickness of the flowable layer.

HDP-CVD is one method which may be used to form the compressive liner and compressive capping layers described herein. During HDP-CVD deposition, the substrate may be in a separate chamber from the chamber used to deposit the flowable layer. An exemplary deposition chamber is the Ultima HDP chamber available from Applied Materials, Santa Clara, Calif. A substrate may be maintained at below about 500° C. or between about 300° C. and about 400° C. during the deposition of compressive films and the total source plasma RF power applied may be between 5000 Watts and 10,000 Watts excluding bias power when processing 300 mm wafers as substrates. The substrate bias power may be between 2000 Watts and 7000 Watts. Higher bias powers correlate with higher compressive stress in the liner and capping layers. Chambers other than the Ultima HDP may be used with conversions in operation conditions obtainable from processing tool suppliers or may simply be known to those of ordinary skill in the art. The frequencies emitted by the non-bias RF power generators may be around 2 MHz, and the frequency emitted by the bias RF power generator may be about 13.56 MHz. A variety of oxygen-containing and silicon-containing sources may be flown into the processing region during HDP-CVD and typical precursors include $O_2$ and $SiH_4$. In the event that these two precursors are used, a flow rate ratio for $O_2$:$SiH_4$ may be between about 0.25:1 and about 1:1.

Flowable film growth may proceed while the substrate temperature is maintained at a relatively low temperature during deposition of the silicon-containing films (which include nitrogen and/or carbon in the examples given above. The flowable oxide film may be deposited on the substrate surface at low temperature which is maintained by cooling the substrate during the deposition. The pedestal may include heating and/or cooling conduits inside the pedestal shaft that set the temperature of the pedestal and substrate between about −40° C. and about 200° C., between about 100° C. and about 160° C., less than about 100° C. or less than about 40° C. in different embodiments.

During growth of flowable films, the pressure in either the chamber plasma region or the substrate processing region may be below or about 100 Torr, below or about 50 Torr, below or about 20 Torr, below or about 10 Torr or below or about 5 Torr. The pressures in either or both regions may be above or about 0.25 Torr, above or about 0.5 Torr, above or about 1 Torr, above or about 2 Torr or above or about 5 Torr in different embodiments. Each of the lower bounds may be combined with any of the upper bounds on the pressures to form additional ranges of suitable pressures according to disclosed embodiments.

The plasma conditions present in the chamber plasma region during the growth of flowable films (to produce radical-oxygen and/or radical-nitrogen precursors) may include an RF power between about 3000 W and about 15,000 W, between about 400 W and about 10,000 W or between about 5000 W and about 8000 W in different embodiments.

Exemplary Substrate Processing System

Figure 4:
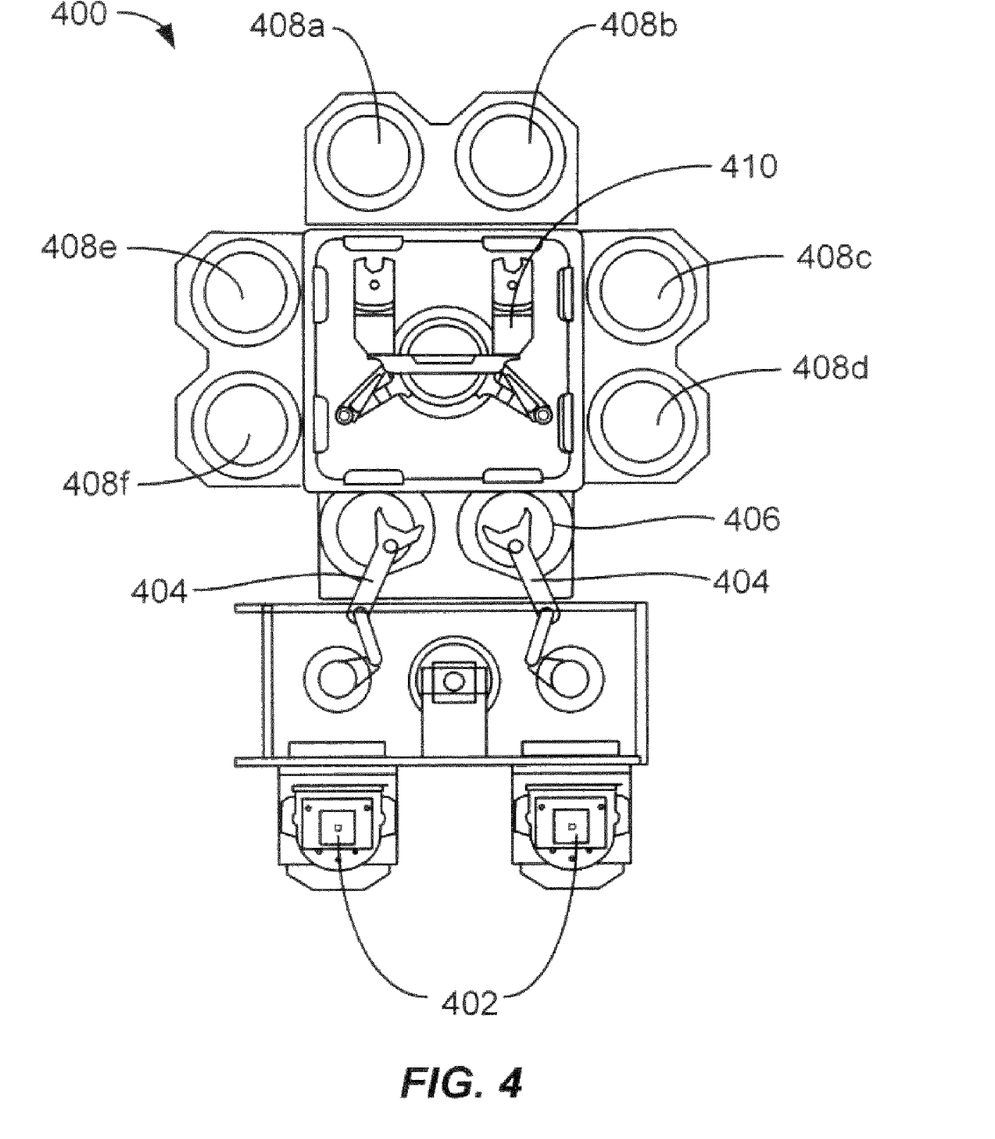
FIG. 4 shows a substrate processing system according to disclosed embodiments.

Embodiments of the deposition systems may be incorporated into larger fabrication systems for producing integrated circuit chips. FIG. 4 shows one such system 400 of deposition, baking and curing chambers according to disclosed embodiments. In the figure, a pair of FOUPs (front opening unified pods) 402 supply substrate substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back.

The processing chambers 408a-f may include one or more system components for depositing, annealing, curing and/or etching a flowable dielectric film on the substrate wafer. In one configuration, two pairs of the processing chamber (e.g., 408c-d and 408e-f) may be used to deposit the flowable dielectric material on the substrate, and the third pair of processing chambers (e.g. 408a-b) may be used to anneal the deposited dielectric. In another configuration, the same two pairs of processing chambers (e.g., 408c-d and 408e-f) may be configured to both deposit and anneal a flowable dielectric film on the substrate, while the third pair of chambers (e.g., 408a-b) may be used for UV or E-beam curing of the deposited film. In still another configuration, all three pairs of chambers (e.g., 408a-f) may be configured to deposit and cure a flowable dielectric film on the substrate. In yet another configuration, two pairs of processing chambers (e.g., 408c-d and 408e-f) may be used for both deposition and UV or E-beam curing of the flowable dielectric, while a third pair of processing chambers (e.g. 408a-b) may be used for annealing the dielectric film. It will be appreciated, that additional configurations of deposition, annealing and curing chambers for flowable dielectric films are contemplated b) system 400.

In addition, one or more of the process chambers 408a-f may be configured as a wet treatment chamber. These process chambers include heating the flowable dielectric film in an atmosphere that include moisture. Thus, embodiments of system 400 may include wet treatment chambers 408a-b and anneal processing chambers 408c-d to perform both wet and dry anneals on the deposited dielectric film.

Figure 5A:
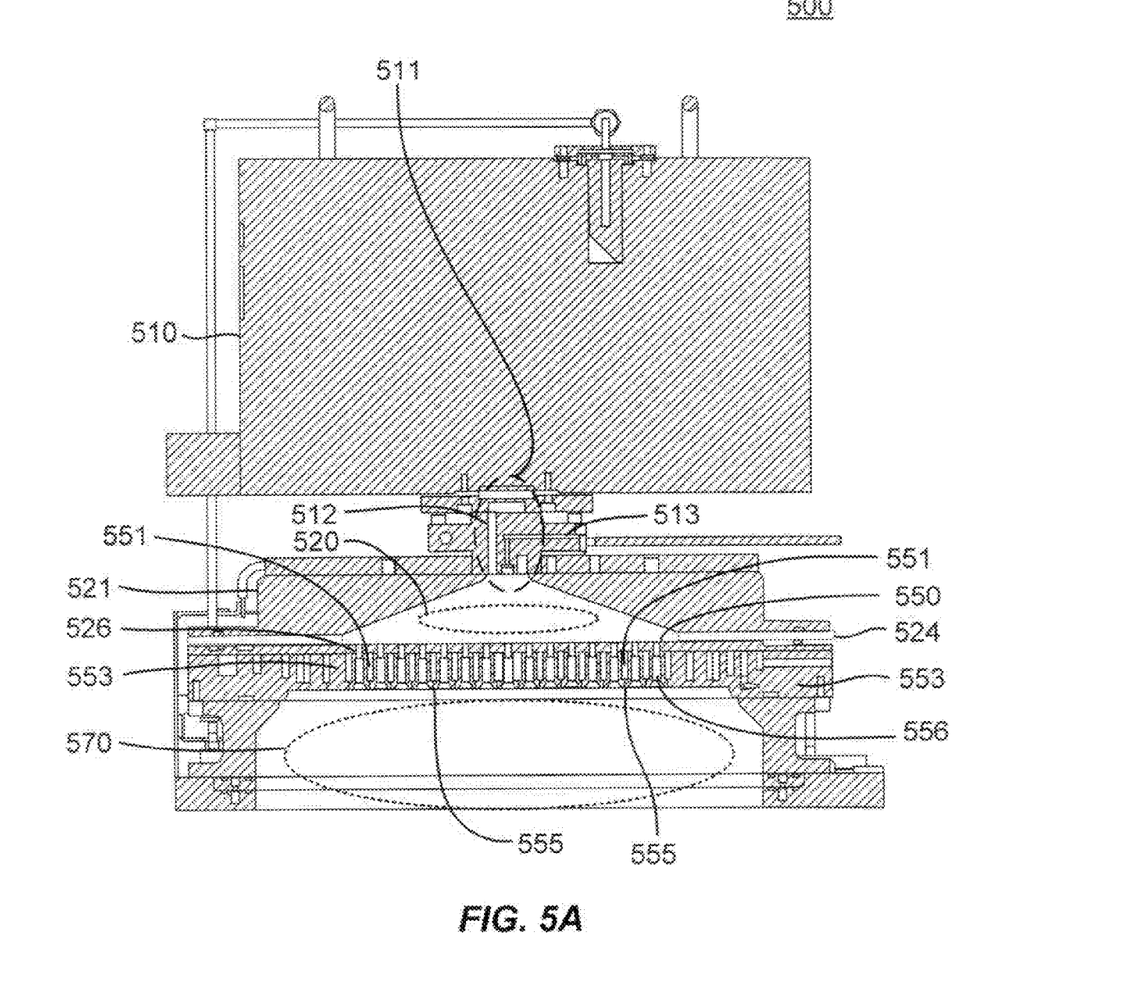
FIG. 5A shows a substrate processing chamber according to disclosed embodiments.

FIG. 5A is a substrate processing chamber 500 according to disclosed embodiments. A remote plasma system (RPS) 510 may process a gas which then travels through a gas inlet assembly 511. Two distinct gas supply channels are visible within the gas inlet assembly 511. A first channel 512 carries a gas that passes through the remote plasma system RPS 510, while a second channel 513 bypasses the RPS 500. The first channel 502 may be used for the process gas and the second channel 513 may be used for a treatment gas in disclosed embodiments. The lid (or conductive top portion) 521 and a perforated partition 553 are shown with an insulating ring 524 in between, which allows an AC potential to be applied to the lid 521 relative to perforated partition 553. The process gas travels through first channel 512 into chamber plasma region 520 and may be excited by a plasma in chamber plasma region 520 alone or in combination with RPS 510. The combination of chamber plasma region 520 and/or RPS 510 may be referred to as a remote plasma system herein. The perforated partition (also referred to as a showerhead) 553 separates chamber plasma region 520 from a substrate processing region 570 beneath showerhead 553. Showerhead 553 allows a plasma present in chamber plasma region 520 to avoid directly exciting gases in substrate processing region 570, while still allowing excited species to travel from chamber plasma region 520 into substrate processing region 570.

Showerhead 553 is positioned between chamber plasma region 520 and substrate processing region 570 and allows plasma effluents (excited derivatives of precursors or other gases) created within chamber plasma region 520 to pass through a plurality of through holes 556 that traverse the thickness of the plate. The showerhead 553 also has one or more hollow volumes 551 which can be filled with a precursor in the form of a vapor or gas (such as a silicon-containing precursor) and pass through small holes 555 into substrate processing region 570 but not directly into chamber plasma region 520. Showerhead 553 is thicker than the length of the smallest diameter 550 of the through-holes 556 in this disclosed embodiment. In order to maintain a significant concentration of excited species penetrating from chamber plasma region 520 to substrate processing region 570, the length 526 of the smallest diameter 550 of the through holes may be restricted by forming larger diameter portions of through-holes 556 part way through the showerhead 553. The length of the smallest diameter 550 of the through-holes 556 may be the same order of magnitude as the smallest diameter of the through-holes 556 or less in disclosed embodiments.

In the embodiment shown, showerhead 553 may distribute (via through holes 556) process gases which contain oxygen, hydrogen and/or nitrogen and/or plasma effluents of such process gases upon excitation by a plasma in chamber plasma region 520. In embodiments, the process gas introduced into the RPS 510 and/or chamber plasma region 520 through first channel 512 may contain one or more of oxygen ($O_2$), ozone ($O_3$), $N_2O$, NO, $NO_2$, $NH_3$, $N_xH_y$ including $N_2H_4$, silane, disilane, TSA and DSA. The process gas may also include a carrier gas such as helium, argon, nitrogen (N₂), etc. The second channel 513 may also deliver a process gas and/or a carrier gas, and/or a film-curing gas used to remove an unwanted component from the growing or as-deposited film. Plasma effluents may include ionized or neutral derivatives of the process gas and may also be referred to herein as a radical-oxygen precursor and/or a radical-nitrogen precursor referring to the atomic constituents of the process gas introduced.

In embodiments, the number of through-holes 556 may be between about 60 and about 2000. Through-holes 556 may have a variety of shapes but are most easily made round. The smallest diameter 550 of through holes 556 may be between about 0.5 mm and about 20 mm or between about 1 mm and about 6 mm in disclosed embodiments. There is also latitude in choosing the cross-sectional shape of through-holes, which may be made conical, cylindrical or a combination of the two shapes. The number of small holes 555 used to introduce a gas into substrate processing region 570 may be between about 100 and about 5000 or between about 500 and about 2000 in different embodiments. The diameter of the small holes 555 may be between about 0.1 mm and about 2 mm.

Figure 5B:
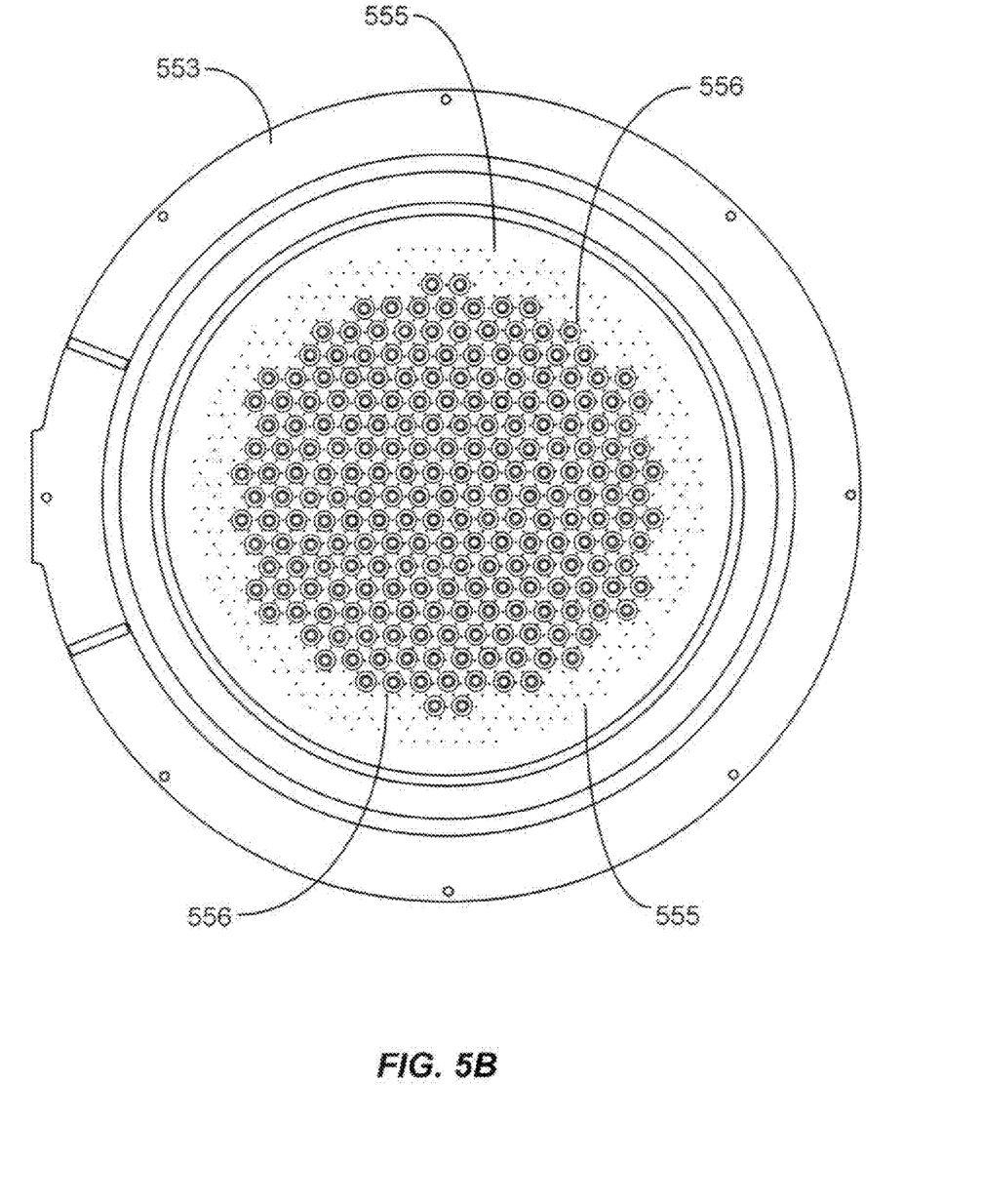
FIG. 5B shows a showerhead of a substrate processing chamber according to disclosed embodiments.

FIG. 5B is a bottom view of a showerhead 553 for use with a processing chamber according to disclosed embodiments. Showerhead 553 corresponds with the showerhead shown in FIG. 5A. Through-holes 556 are depicted with a larger inner-diameter (ID) on the bottom of showerhead 553 and a smaller ID at the top. Small holes 555 are distributed substantially evenly over the surface of the showerhead, even amongst the through-holes 556 which helps to provide more even mixing than other embodiments described herein.

An exemplary film is created on a substrate supported by a pedestal (not shown) within substrate processing region 570 when plasma effluents arriving through through-holes 556 in showerhead 553 combine with a silicon-containing precursor arriving through the small holes 555 originating from hollow volumes 551. Though substrate processing region 570 may be equipped to support a plasma for other processes such as curing, no plasma is present during the growth of the exemplary film.

A plasma may be ignited either in chamber plasma region 520 above showerhead 553 or substrate processing region 570 below showerhead 553. An AC voltage typically in the radio frequency (RF) range is applied between the conductive top portion 521 of the processing chamber and showerhead 553 to ignite a plasma in chamber plasma region 520 during deposition. The top plasma is left at low or no power when the bottom plasma in the substrate processing region 570 is turned on to either cure a film or clean the interior surfaces bordering substrate processing region 570. A plasma in substrate processing region 570 is ignited by applying an AC voltage between showerhead 553 and the pedestal or bottom of the chamber. A cleaning gas may be introduced into substrate processing region 570 while the plasma is present.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the CVD machine. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A gas in an "excited state" as used herein describes a gas wherein at least some of the gas molecules are in vibrationally-excited, dissociated and/or ionized states. A gas may be a combination of two or more gases. The term trench is used throughout with no implication that the etched geometry necessarily has a large horizontal aspect ratio. Viewed from above the surface, trenches may appear circular, oval, polygonal, rectangular, or a variety of other shapes.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon oxide layer on a substrate containing a trench, the method comprising:
    transferring the substrate into a substrate processing region in a substrate processing chamber;
    flowing a plasma precursor into a remote plasma region to form plasma effluents;
    combining the plasma effluents with a flow of a silicon-containing precursor in the substrate processing region, wherein the flow of the silicon-containing precursor has not been excited by a plasma;
    forming a silicon-and-nitrogen-containing layer on the substrate and in the trench;
    forming a compressive capping layer over the silicon-and-nitrogen-containing layer; and
    heating the substrate in an oxygen-containing atmosphere to convert the carbon-free silicon-and-nitrogen containing layer to the silicon oxide layer.

2. The method of claim 1 further comprising an operation of forming a compressive liner layer prior to the operation of forming the silicon-and-nitrogen-containing layer on the substrate.

3. The method of claim 1 further comprising an operation of curing the silicon-and-nitrogen-containing layer in an ozone-containing atmosphere prior to the operation of forming the compressive capping layer.

4. The method of claim 1 wherein the silicon-containing precursor comprises a silicon-and-nitrogen-containing precursor and the plasma effluents comprise a radical-nitrogen precursor.

5. The method of claim 4, wherein the silicon-and-nitrogen-containing precursor comprises at least one of $H_2N(SiH_3)$, $HN(SiH_3)_2$, and $N(SiH_3)_3$ and the plasma precursor comprises at least one of $N_2O$, $NO$, $NO_2$, $NH_4OH$, $NH_3$, $N_2$ and $H_2$.

6. The method of claim 1, wherein the oxygen-containing atmosphere comprises at least one of $O_2$, $O_3$ and $H_2O$.

7. The method of claim 1, wherein the trench has a width of about 50 nm or less.

8. The method of claim 1, wherein the remote plasma region is within the substrate processing chamber and separated from the substrate processing chamber by a showerhead.

9. The method of claim 1, wherein the compressive capping layer is deposited using one of a furnace, PECVD, LPCVD and HDP-CVD.

* * * * *